United States Patent [19]
Nakashiba

[11] Patent Number: 5,521,405
[45] Date of Patent: May 28, 1996

[54] CHARGE TRANSFER DEVICE WITH TWO-PHASE TWO-LAYERED ELECTRODE STRUCTURE AND METHOD FOR FABRICATING THE SAME

[75] Inventor: Yasutaka Nakashiba, Tokyo, Japan

[73] Assignee: NEC Corporation, Tokyo, Japan

[21] Appl. No.: 235,706

[22] Filed: Apr. 29, 1994

[30] Foreign Application Priority Data

Apr. 30, 1993 [JP] Japan ................................. 5-128060

[51] Int. Cl.$^6$ .................... H01L 29/768; H01L 27/148
[52] U.S. Cl. .................... 257/248; 257/221; 257/231; 257/250
[58] Field of Search ........................ 257/221, 246–248, 257/251, 250, 231

[56] References Cited

U.S. PATENT DOCUMENTS

| | | | |
|---|---|---|---|
| 3,745,383 | 7/1973 | Sangster | 257/251 |
| 4,157,558 | 6/1979 | Weckler | 257/251 |
| 4,250,517 | 2/1981 | Tseng | 257/251 |
| 4,709,380 | 11/1987 | Itoh | 257/251 |
| 4,814,844 | 3/1989 | Bluzer | 257/247 |
| 4,995,061 | 2/1991 | Hynecek | 257/247 |
| 5,315,137 | 5/1994 | Asaumi et al. | 257/248 |
| 5,402,459 | 3/1995 | Hynecek | 257/247 |

*Primary Examiner*—Gene M. Munson
*Attorney, Agent, or Firm*—Popham, Haik, Schnobrich & Kaufman, Ltd.

[57] ABSTRACT

A charge transfer device is arranged such that a plurality of first kind charge transfer electrodes and a plurality of second kind charge transfer electrodes are alternately provided on an insulating film, and every other ones of the second kind charge transfer electrodes are grouped into a first and a second group. Potential barriers are provided at upstream portions of the charge transfer region beneath the respective second kind charge transfer electrodes. A first metal interconnect interconnects commonly the first kind charge transfer electrodes, a second metal interconnect interconnects commonly the first group second kind charge transfer electrodes, and a third metal interconnect interconnects commonly the second group second kind charge transfer electrodes. The first kind charge transfer electrodes receive a constant potential, and the first group second charge transfer electrodes and the second group second kind charge transfer electrodes respectively receive clock pulses having phases opposite to each other. The first and second kind charge transfer electrodes do not need to be overlapped with each other at contact portions so that the aspect ratio can be reduced and the occurrence of defects in metal interconnects can be prevented.

9 Claims, 9 Drawing Sheets

CHARGE TRANSFER DEVICE WITH TWO-PHASE TWO-LAYERED ELECTRODE STRUCTURE AND METHOD FOR FABRICATING THE SAME

BACKGROUND OF THE INVENTION (1) Field of the Invention

The present invention relates to a charge transfer device, and more particularly to a charge transfer device having a two-phase driving/two-layered electrode structure, to a method of driving such charge transfer device, and to a method for fabricating such charge transfer device.

(2) Description of the Related Art

Main fabrication steps of a conventional charge transfer device having a two-phase buried channel/two-layered electrode structure of the kind to which the present invention relates are shown in diagrammatic sectional views in FIGS. 1A–1D. For this conventional charge transfer device, reference is made to an article entitled "AN OVERLAPPING ELECTRODE BURIED CHANNEL CCD", IEDM Technical Digest, 1973, pp 24–26, and also to an article entitled "TWO-PHASE CHARGE COUPLED LINEAR IMAGING DEVICES", IEDM Technical Digest, 1974, pp 55–58. The conventional charge transfer device shown in FIGS. 1A–1D is used, for example, in a horizontal shift register of a solid-state image sensor device.

For fabricating the conventional charge transfer device referred to above, an n-type semiconductor region 102 which becomes a charge transfer region is formed within a p-type semiconductor substrate 101, a first insulating film 103 is formed on a surface of the n-type semiconductor region 102 by thermal oxidation, and a first conductive electrode 104 is formed on the first insulating film 103 by known processes of polycrystalline silicon deposition and photolithography. Then, an exposed portion of the first insulating film 103 is removed using the first conductive electrode 104 as a mask. Then, by applying the thermal oxidation again, a second insulating film 105 is formed over the semiconductor substrate and the first conductive electrode 104 as shown in FIG. 1A.

Next, a p-type impurity (for example, boron (B)) is implanted using the first conductive electrodes 104 as masks whereby an $n^-$-type semiconductor region 106 which becomes a potential barrier to the charge transfer is formed within the n-type semiconductor region 102 between the first conductive electrodes 104 as shown in FIG. 1B.

Then, by again using the known processes of polycrystalline silicon deposition and photolithography, a second conductive electrode 107 is formed between the first conductive electrodes 104 in a state in which an end portion of the second conductive electrode 107 overlaps an end portion of a corresponding adjacent one of the first conductive electrodes 104 as shown in FIG. 1C.

Thereafter, an interlayer insulating film (not shown) is formed, and the first conductive electrode 104 and the second conductive electrode 107 are paired with the interlayer insulating film intervening therebetween. By connecting every other pairs of them to metal interconnects 108a and 108b, respectively, there is provided a conventional charge transfer device having a two-phase driving/two-layered electrode structure as shown in FIG. 1D.

FIG. 2 shows in a diagrammatic plan view a general configuration of a conventional solid-state image sensor device. There, an incident beam of light is photoelectrically converted at photoelectric conversion sections 220 which are provided in a two-dimensional form. The signal charge thus obtained is read out to a vertical transfer section 240, is transferred to a horizontal transfer section 260 through the vertical transfer section 240, is transferred to an output circuit section 280 through the horizontal transfer section 260, and is taken out from the output circuit section 280 as an output signal electrically converted to an electrical signal.

FIG. 3 represents details of the portions shown by a dashed line block in FIG. 2 and shows in a diagrammatic plan view an exemplary solid-state image sensor in which the charge transfer device having the two-phase driving/two-layered electrode structure described above is used as a horizontal transfer section. The diagrammatic sectional views of FIGS. 1A–1D for explaining the fabrication steps have been taken from dashed line portions in FIG. 3.

The horizontal transfer section is comprised of the n-type semiconductor region 102 serving as the horizontal charge transfer region, the first and second conductive electrodes 104 and 107 formed on the n-type semiconductor region 102, and the metal interconnects 108a and 108b which are connected with these electrodes through contact holes 109 and which are for supplying clock pulses (drive pulses) $\phi_1$ and $\phi_2$ to these electrodes.

The vertical transfer section is comprised of the n-type semiconductor region 102a serving as the vertical charge transfer region and a charge transfer electrode (only the last transfer electrode 104c of the vertical transfer section is shown) formed on the n-type semiconductor region 102a.

The operation of the conventional charge transfer device shown in FIGS. 1A–1D, 2 and 3 is now explained with reference to FIGS. 4A–4E. In FIG. 4A, where the first conductive electrodes and the second conductive electrodes are referred to with reference numerals 104 and 107, a letter "a" and a letter "b" depending on the groups to which such electrodes belong are attached to the numerals concerned. The first and second conductive electrodes 104a and 107a in the first group are driven by the clock pulses $\phi_1$, and the first and second conductive electrodes 104b and 107b in the second group are driven by the clock pulses $\phi_2$. The clock pulses $\phi_1$ and $\phi_2$ have phases opposite to each other.

As shown in FIG. 4A, every other pairs of the first conductive electrodes 104a and the second conductive electrodes 107a belonging to the first group are interconnected and every other pairs of the first conductive electrodes 104b and the second conductive electrodes 107b belonging to the second group are interconnected. FIGS. 4B–4D show states of potentials of the n-type semiconductor region 102 and the $n^-$-type semiconductor region at timings $t_b$, $t_c$ and $t_d$ shown in FIG. 4E when the clock pulses $\phi_1$ and $\phi_2$ are applied respectively to the first group electrodes and the second group electrodes.

At the timing $t_b$, the signal charge 111 transferred from the vertical transfer section are charged under the first conductive electrode 104b as shown in FIG. 4B, to which electrode a high voltage $V_H$ is being applied.

At the timing $t_c$, a potential well under the first conductive electrode 104b rises in response to voltage changes of clock pulses but the signal charge 111 does not move and remains in place as shown in FIG. 4C.

At the timing $t_d$, the signal charge 111 is transferred to a position under the adjacent first conductive electrode 104a where a deep potential well is formed due to the application of the high voltage $V_H$, as shown in FIG. 4D.

By the repetition of this operation, the signal charge 111 is sequentially transferred to the left in the drawings.

Here, the potential barriers formed under the second conductive electrodes 107a and 107b serve to prevent the retrogression of the signal charge and to regulate the direction in which the signal charge 111 is transferred.

In the conventional charge transfer device having the two-phase driving/two-layered electrode structure described above, especially where this device is employed in a horizontal transfer section of a highly integrated solid-state image sensor, there have been problems in that an aspect ratio, that is, a ratio of the step formed between the two-layered overlapped conductive electrodes (typically formed of polycrystalline silicon) and a surface of the semiconductor substrate to the distance of the two-layered overlapped conductive electrodes becomes large, and the occurrence of short-circuiting between interconnects at a portion "A" indicated in FIG. 3 is likely due to processing defects in the interconnects (such as metal residues).

Also, the conventional device has suffered from a low production yield due to connection failures caused by defects in contact holes (defective opening) or excess etching of conductive electrodes. These problems are accounted for from such factors that the aspect ratio is large as mentioned above, that the thickness of the interlayer insulating film formed on the first conductive electrodes and that on the second conductive electrodes are different, and that the number of contact holes is large.

SUMMARY OF THE INVENTION

An object of the present invention, therefore, is to overcome the problems existing in the prior art and to provide a charge transfer device, a method of using such device, and a method for fabricating such device.

According to one aspect of the invention, there is provided a charge transfer device comprising:

a semiconductor substrate;

a charge transfer region provided within a surface region of the semiconductor substrate;

an insulating film provided on the charge transfer region;

a plurality of first and second kind charge transfer electrodes alternately provided on the insulating film, the second kind charge transfer electrodes being divided into a first and a second group with every other ones of such electrodes respectively belonging to the first and the second group;

a plurality of potential barriers each provided at an upstream portion, in terms of a charge transfer direction, of the charge transfer region beneath a corresponding one of the second kind charge transfer electrodes;

a first metal interconnect for commonly connecting the first kind charge transfer electrodes;

a second metal interconnect for commonly connecting the second kind charge transfer electrodes of the first group; and a third metal interconnect for commonly connecting the second kind charge transfer electrodes of the second group.

In the charge transfer device according to the invention, the first kind charge transfer electrodes receive a constant potential, and the second kind charge transfer electrodes (first group) and the second kind charge transfer electrodes (second group) respectively receive clock pulses having phases opposite to each other. Thus, it is unnecessary for the first kind charge transfer electrodes and the second kind charge transfer electrodes to be over-lapped with each other at contact portions, and this makes it possible to reduce the aspect ratio to half that in the prior art arrangement and to prevent the occurrence of defects in metal interconnects. Facts that the aspect ratio is reduced, the thicknesses of the interlayer insulating films at portions where contact holes are opened are uniform and the number of the contact holes is reduced to ½–¼ all contribute to the significant reduction of the occurrence of defects in the contact holes.

BRIEF DESCRIPTION OF THE DRAWINGS

The above and other objects, features and advantages of the present invention will be apparent from the following description of preferred embodiments of the invention explained with reference to the accompanying drawings, in which.

PREFERRED EMBODIMENTS OF THE INVENTION

Now, preferred embodiments of the invention are explained with reference to the accompanied drawings.

FIGS. 5A–5D show, in a diagrammatic sectional view, a charge transfer device having a two-phase buried channel/two-layered electrode structure of a first embodiment according to the invention. The fabrication steps of the device are explained hereinafter.

First, an n-type semiconductor region 502 which becomes a charge transfer region is formed within a p-type semiconductor substrate 501, and a first insulating film 503 is formed on a surface of the n-type semiconductor region 502 by thermal oxidation.

Figure 5A:
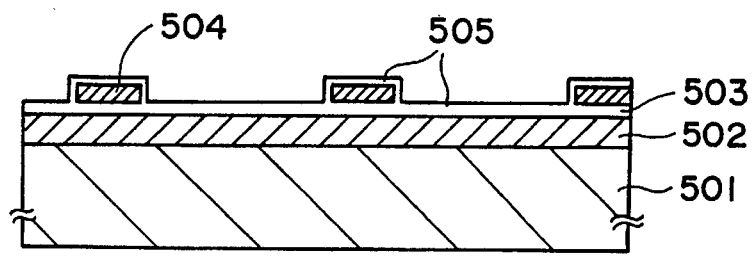
FIGS. 5A–5D are diagrammatic sectional views showing a charge transfer device of a first embodiment according to the invention, for explaining the process steps for the fabrication thereof.

Next, a polycrystalline silicon film which is a first layer is deposited on the entire surface of the first insulating film 503 by a Chemical Vapor Deposition (CVD) process, and a plurality of first kind charge transfer electrodes 504 are formed with predetermined intervals by known processes of photolithography and dry etching. Then, an exposed portion of the first insulating film 503 is removed using the first kind charge transfer electrodes 504 as masks. Then, by applying the thermal oxidation again, a second insulating film 505 is formed over the semiconductor substrate and the first kind charge transfer electrodes 504, as shown in FIG. 5A.

Figure 5B:
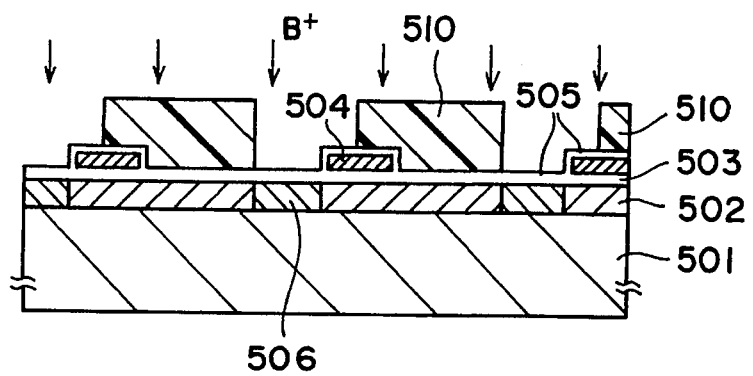

Subsequently, by using a photolithography technique, there is formed a photoresist film 510 which covers a region disposed between the first kind charge transfer electrodes and at a downstream in terms of the charge transfer direction. With the photoresist film 510 thus formed and the first kind charge transfer electrodes 504 as masks, an impurity (for example, boron (B)) of an opposite conductivity type is ion-implanted within the n-type semiconductor region 502, whereby the n⁻-type semiconductor region 506 which determines the charge transfer direction is formed in self-alignment with a corresponding one of the first kind charge transfer electrodes 504 as shown in FIG. 5B.

Figure 5C:
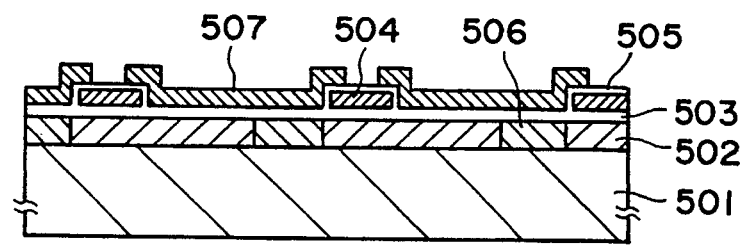

Then, after the removal of the photoresist film 510, by using the CVD process, a polycrystalline silicon film which is a second layer is deposited on the entire surface of the second insulating film 505 and, by using known photolithography and dry etching processes, the second kind charge transfer electrodes 507 are formed such that these electrodes extend over the n-type semiconductor region 502 and the n⁻-type semiconductor region 506 and their ends respectively cover ends of the first kind charge transfer electrodes 504 as shown in FIG. 5C.

Figure 5D:
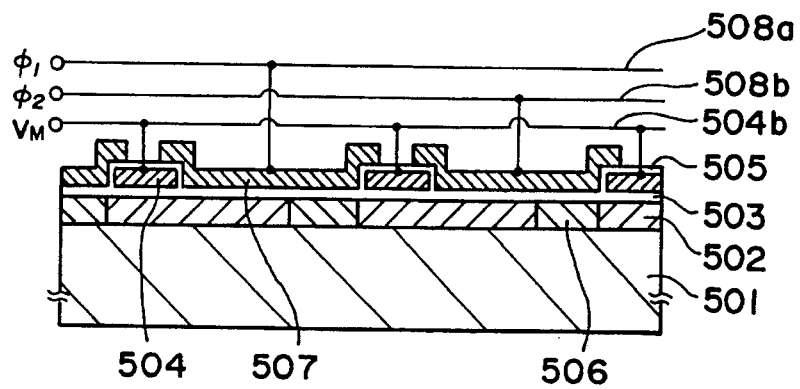

Thereafter, all interlayer insulating film (not shown) having a thickness of about 0.7 μm is formed on the entire surface and, after a contact hole 509 (see FIG. 6) is opened over the second kind charge transfer electrodes 507, an aluminum film is formed. This aluminum film is then patterned so that the metal interconnects 508a and 508b are formed, which are respectively connected with every other second kind charge transfer electrodes 507. This completes the fabrication of the charge transfer device of the first embodiment of the invention as shown in FIG. 5D.

Figure 6:
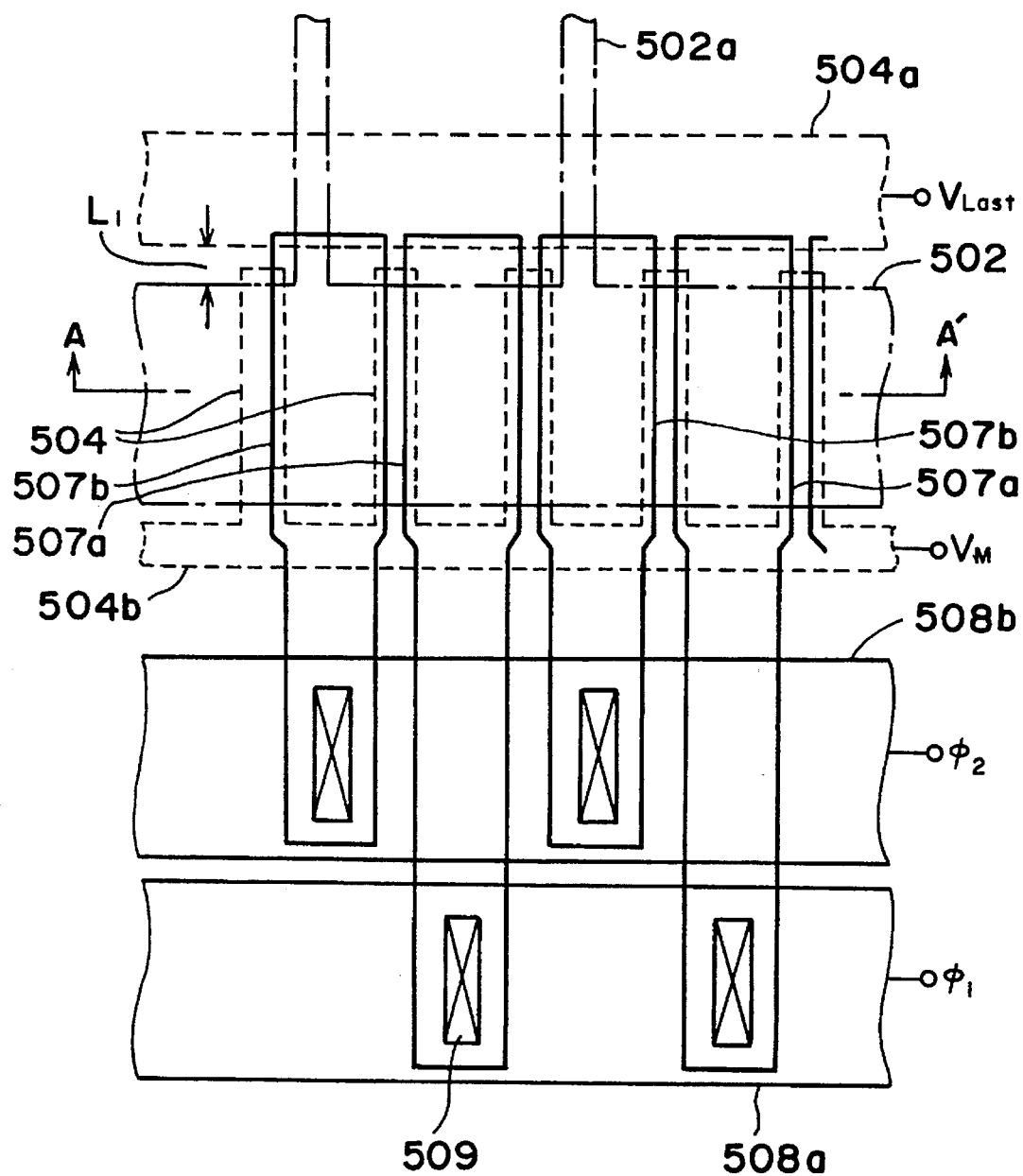
FIG. 6 is a diagrammatic plan view of the charge transfer device of the first embodiment according to the invention, fabricated according to the process steps shown in FIGS. 5A–5D, the sectional views of the structure shown in FIGS. 5A–5D being taken at line A—A' of FIG. 6.

FIG. 6 shows in a plan view a configuration of the charge transfer device fabricated according to the process steps shown in FIGS. 5A–5D. Here, the charge transfer device of this first embodiment is used as a horizontal shift register in a solid-state Image sensor. The sectional views of the structure shown in FIGS. 5A–5D are taken at line A—A' of FIG. 6.

As shown in FIG. 6, the n-type semiconductor region 502 constitutes a charge transfer region of the horizontal transfer section, and the n-type semiconductor region 502a branched from the n-type semiconductor region 502 constitutes a charge transfer region of the vertical transfer section.

The first kind charge transfer electrodes 504 formed on the n-type semiconductor region 502 are short-circuited by the interconnect 504b which Is formed in the same process as that for those electrodes 504.

The vertical transfer section also has a plurality of charge transfer electrodes but, in the drawings, only the last transfer electrode 504a is seen. The second kind charge transfer electrodes 507 are connected respectively to every other metal interconnect 508a and 508b through the contact holes 509. It should be noted that the number of the contact holes is reduced to half that in the conventional device.

Figure 7A:
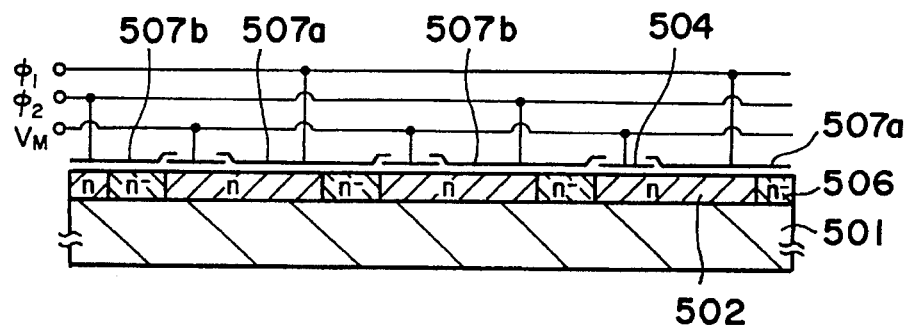
FIG. 7A is a diagrammatic sectional view showing states of interconnections In the device of the first embodiment according to the invention.

The operation of the charge transfer device of this embodiment is now explained with reference to FIGS. 7A–7E. FIG. 7A is a diagrammatic sectional view of the structure viewed at line A–A' of FIG. 6.

In FIG. 7A, a letter "a" is attached to the reference numerals for those of the second kind charge transfer electrodes belonging to the first group thereof, and a letter "b" is attached to those of the second kind charge transfer electrodes belonging to the second group thereof. The second kind charge transfer electrodes 507a belonging to the first group thereof are driven by the clock pulses $\phi_1$ and the second kind charge transfer electrodes 507b belonging to the second group thereof are driven by the clock pulses $\phi_2$. To the first kind charge transfer electrodes 504, a constant voltage $V_M$ is applied.

Figure 7B:
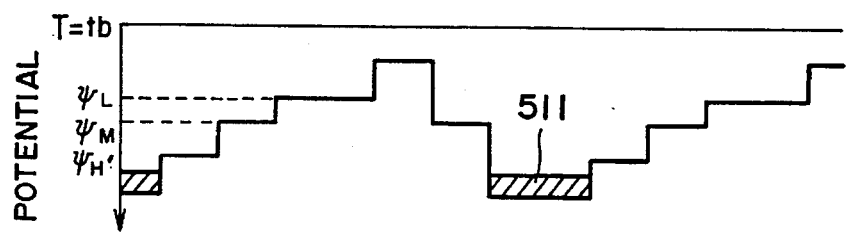
FIGS. 7B–7E are potential diagrams for explaining the operation of the device according to the invention.
Figure 7C:
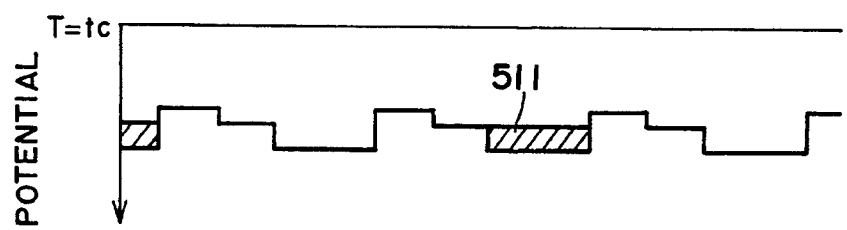
Figure 7D:
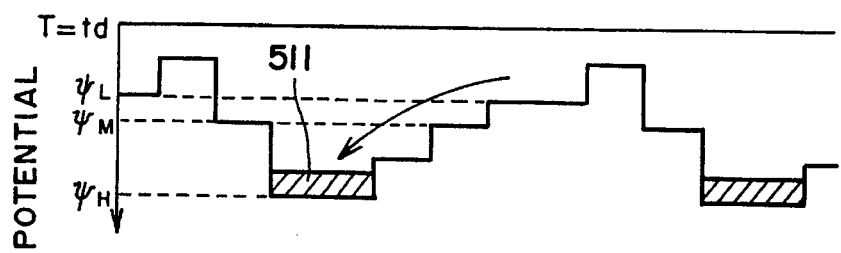
Figure 7E:
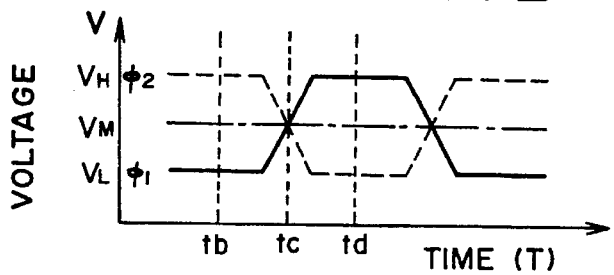

FIG. 7A shows the interconnection or wiring in the device. FIGS. 7B–7D show potential diagrams for explaining the operation of the device of this embodiment. When the constant voltage $V_M$ is applied to the first kind charge transfer electrodes 504 and the clock pulses $\phi_1$ and $\phi_2$ are applied respectively to the first group second kind charge transfer electrodes 507a and the second group second kind charge transfer electrodes 507b. the potential states of the n-type semiconductor region 502 and the n⁻-type semiconductor region 506 at timings $t_b$, $t_c$ and $t_d$ shown in FIG. 7E are as shown in FIGS. 7B–7D.

Specifically, at the timing $t_b$, the signal charge 511 transferred from the vertical transfer section is charged in the n-type semiconductor region 502 under the second kind charge transfer electrodes (second group) 507b to which a high voltage $V_H$ is applied. Here, as shown in FIG. 7B, to the first kind charge transfer electrodes 504, there is applied the constant voltage $V_M$ in which the potential $\psi_M$ formed under the first kind charge transfer electrodes 504 is shallower than the potential $\psi_H'$ formed in the n⁻-type semiconductor region 506 under the second kind charge transfer electrodes (second group) 507b to which the high voltage $V_H$ is applied and is deeper than the potential $\psi_L$ formed in the n-type semiconductor region 502 under the second kind charge transfer electrodes (first group) 507a to which a low voltage $V_L$ is applied. Thus, the first kind charge transfer electrodes effectively function as non-active barrier electrodes.

At the timing $t_c$, the potential well under the second kind charge transfer electrode (second group) 507b rises in response to the voltage changes of the clock pulses but the signal charge 511 remains in place as shown in FIG. 7C.

At the timing $t_d$, when the clock pulse $\phi_1$ turns to a high voltage $V_H$, the signal charge 511 passes through the semiconductor region under a next first kind charge transfer electrode 504 and a next-after-next n⁻-type semiconductor region 506 and moves to a region under an adjacent second kind charge transfer electrode (first group) 507a where a deep potential well is formed upon the high voltage $V_H$ being applied, as shown in FIG. 7D.

Thus, by repeating the above operation, the signal charge 511 is sequentially transferred to the left in the drawings.

Here, the potential barriers (n⁻-type semiconductor regions 506) formed under the second kind charge transfer electrodes 507a and 507b prevent the retrogression of the signal charge and regulate the transferring direction thereof.

Figure 8:
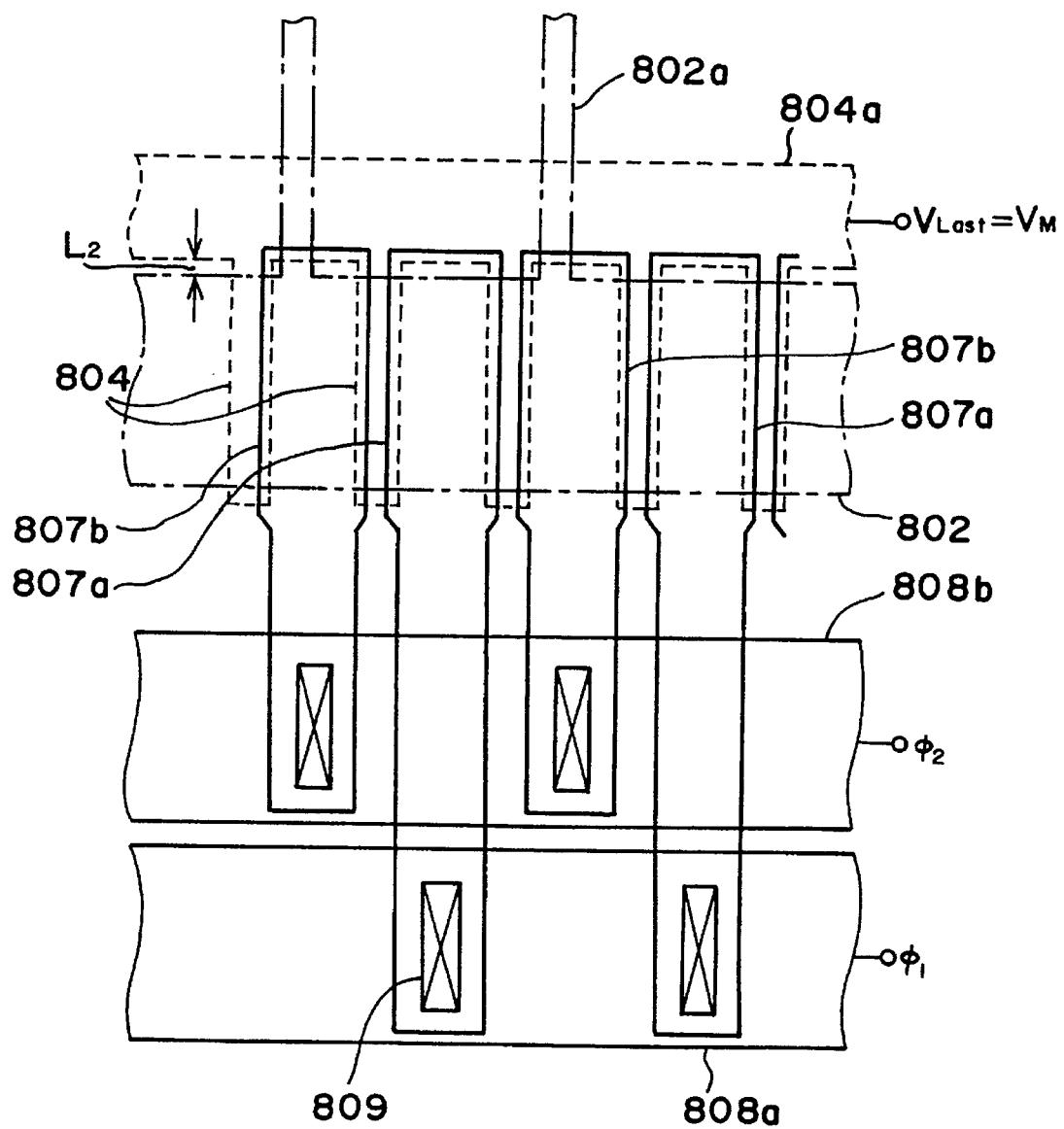
FIG. 8 is a diagrammatic plan view of the device of a second embodiment according to the invention.

FIG. 8 shows in a plan view an arrangement of a second embodiment according to the invention. Here, the same or similar elements as in the first embodiment of FIG. 6 are indicated with the last two digits of the reference numerals having the same numbers as those for the first embodiment, and the repetition of the descriptions therefor is omitted. In this embodiment, the first kind charge transfer electrodes 804 are formed integrally with the last transfer electrode 804a of the vertical transfer section. The operation of the device of this second embodiment is similar to that of the first embodiment.

Figure 9:
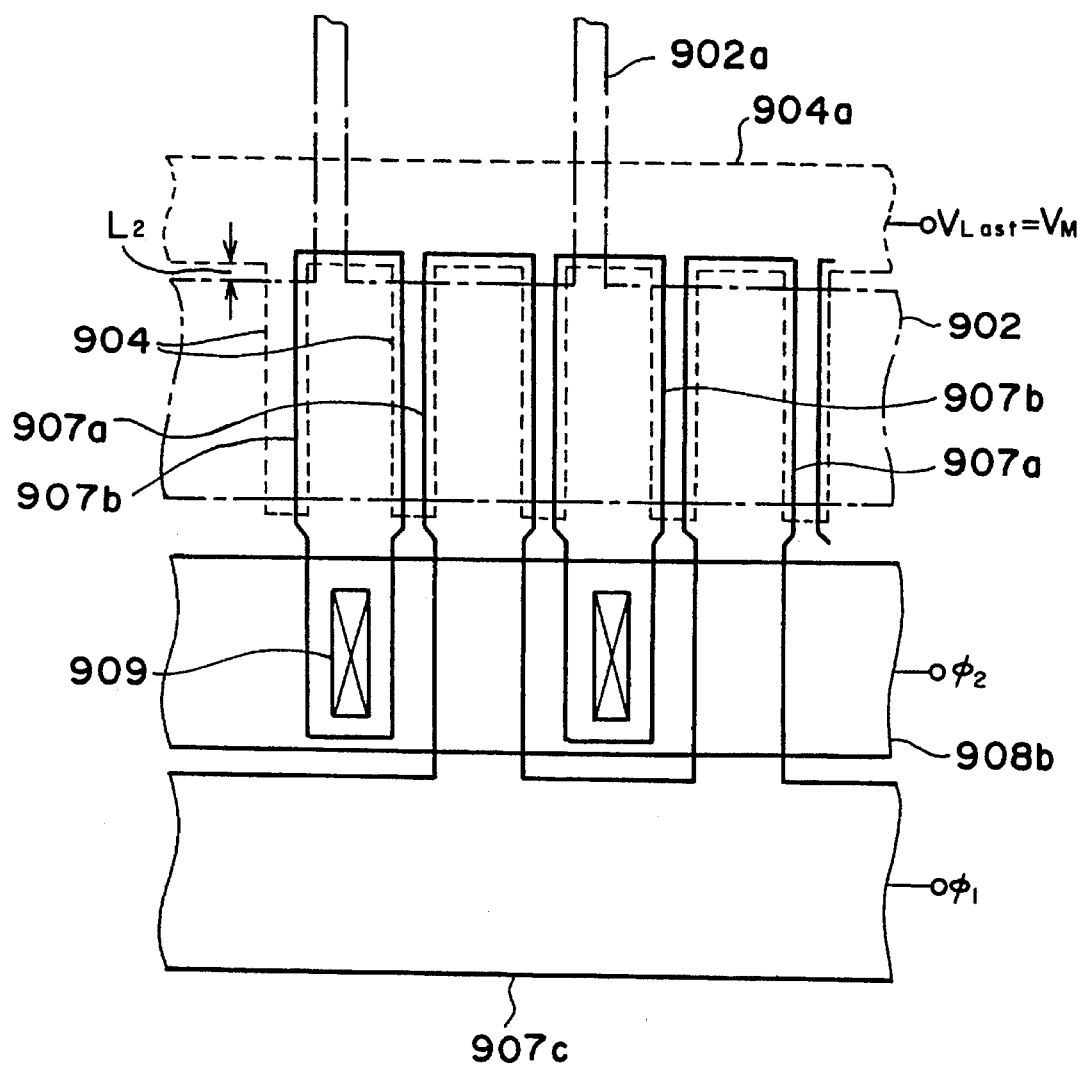
FIG. 9 is a diagrammatic plan view of the device of a third embodiment according to the invention.

FIG. 9 shows in a plan view an arrangement of a third embodiment according to the invention. Here again, the same or similar elements as in the first embodiment of FIG. 6 are indicated with the last two digits of the reference numerals having the same numbers as those for the first embodiment. In this embodiment, in addition to the arrangement wherein the first kind charge transfer electrodes 904 are formed integrally with the last transfer electrode 904a of the vertical transfer section, the metal interconnect to which the clock pulses $\phi_1$ are applied are omitted and, instead thereof, the second kind charge transfer electrodes (first group) 907a receive the clock pulses $\phi_1$ through interconnects 907c formed integrally with these second kind charge transfer electrodes 907a. In this embodiment, the number of contact holes can be reduced to half that in the first and second embodiments. The operation of the device of this third embodiment is similar to that in the above two embodiments.

The invention is not limitative to the above respective embodiments. For example, the materials for the charge transfer electrodes and the metal interconnects may well be other than those used in the embodiments, and the n-type semiconductor region may well be provided in a p-type well layer. Also, the present invention may be embodied not only in a buried channel type but also in a surface channel type charge transfer device.

Figure 1A:
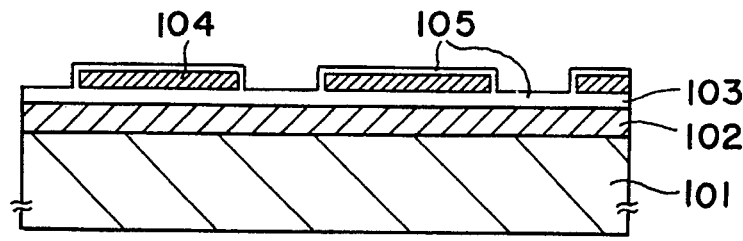
FIGS. 1A–1D are diagrammatic sectional views showing a conventional charge transfer device for explaining the fabrication steps thereof.
Figure 1B:
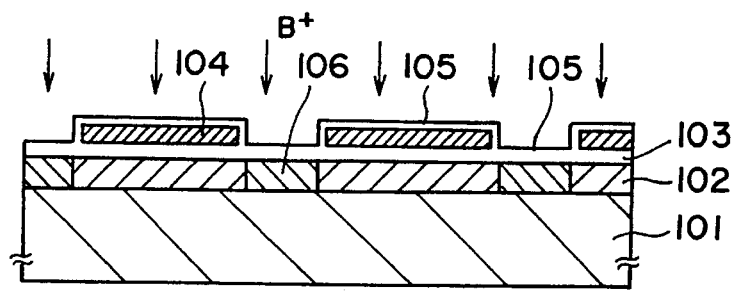
Figure 1C:
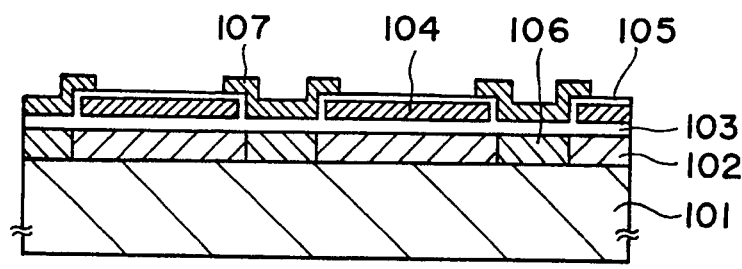
Figure 1D:
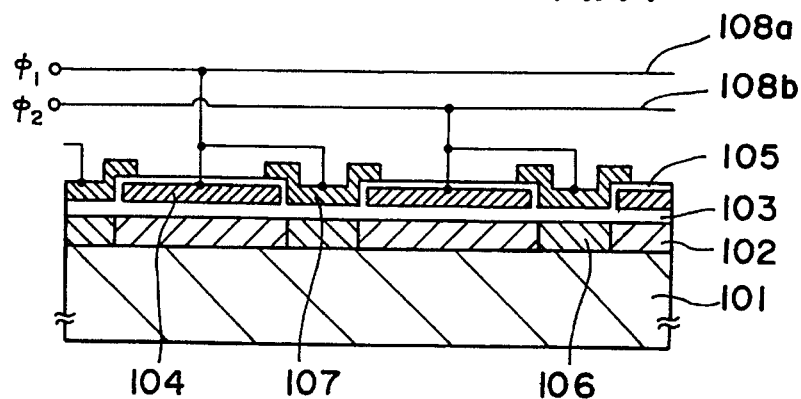
Figure 2:
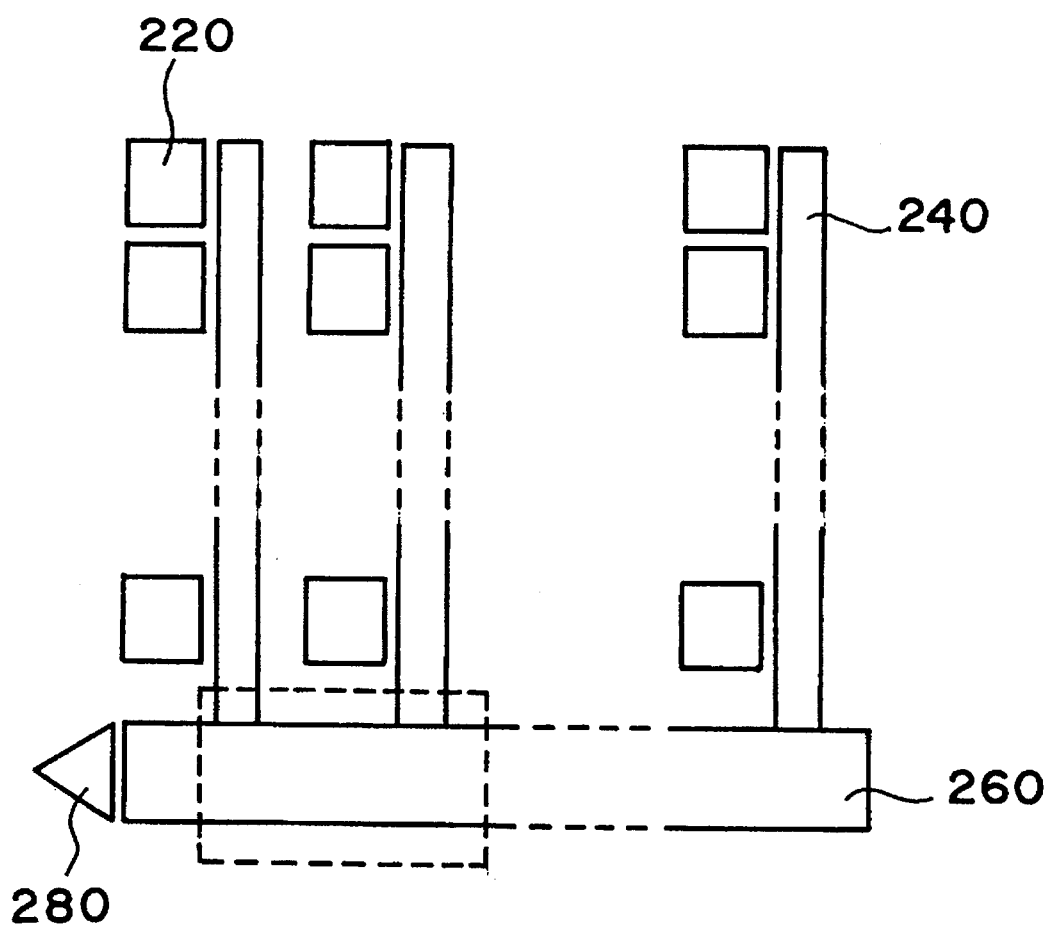
FIG. 2 is a diagrammatic plan view showing a general configuration of a conventional solid-state image sensor.
Figure 3:
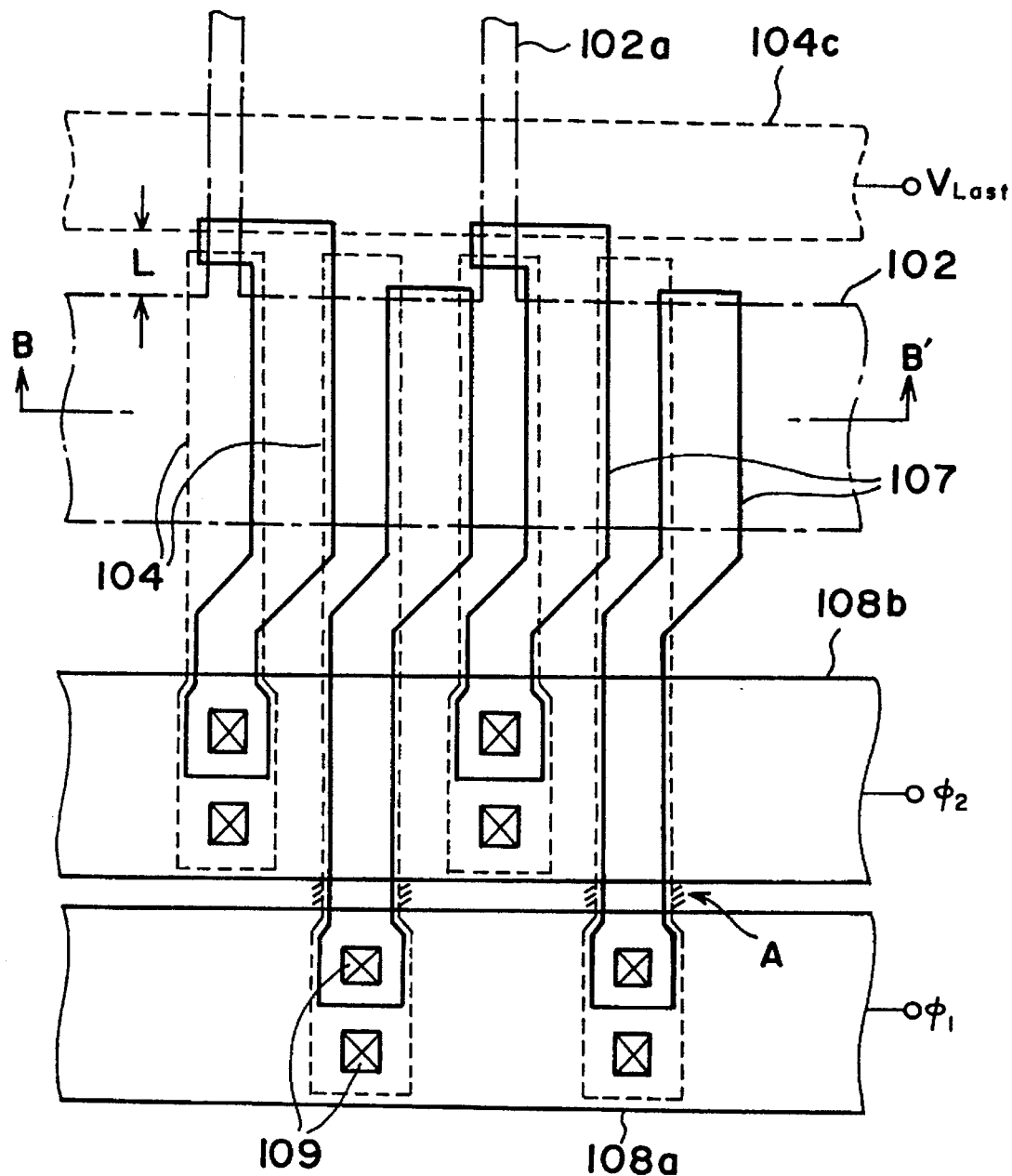
FIG. 3 is a diagrammatic plan view showing details of the portion shown by a dashed line block in FIG. 2.
Figure 4A:
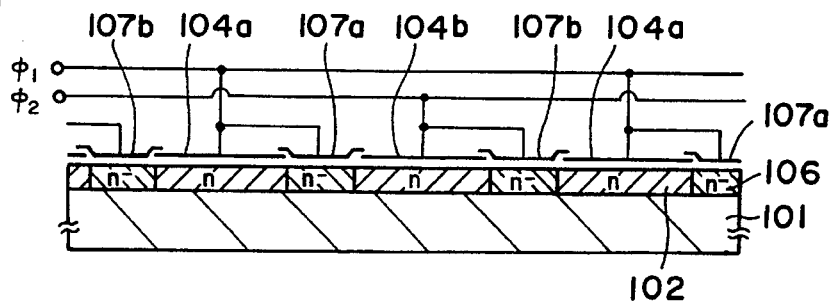
FIG. 4A is a diagrammatic sectional view showing states of interconnections in a conventional device.
Figure 4B:
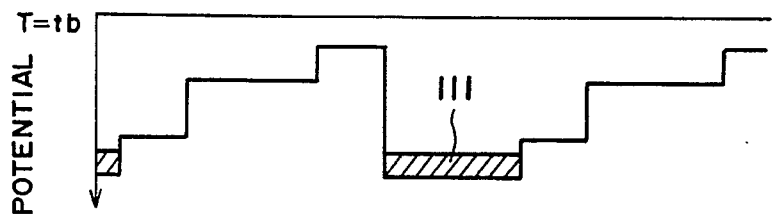
FIGS. 4B–4E are potential diagrams for explaining the operation of the conventional device.
Figure 4C:
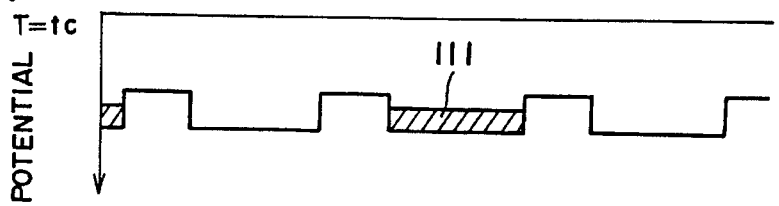
Figure 4D:
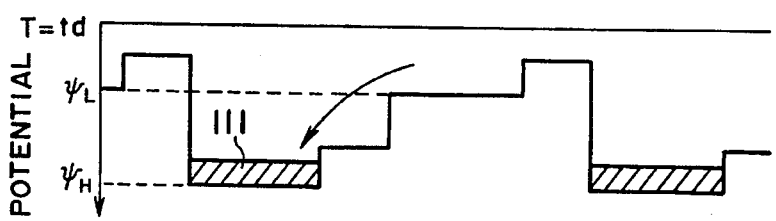
Figure 4E:
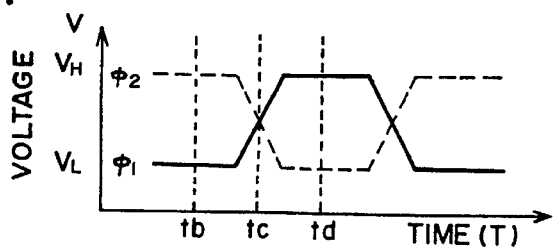

According to the invention, since the potential distribution or gradient which regulates charge transfer is with a large number of steps, even where the potential relationship between the potential $\psi_H$ formed under the charge transfer electrodes to which a high voltage $V_H$ is applied and the potential $\psi_L$ formed under the charge transfer electrodes to which a low voltage $V_L$ is applied is the same as in the prior art, it provides a higher fringe electric field and thus a higher transfer efficiency for signal charge (especially, for minute level signal charge) as compared with those in the prior art.

Where the charge transfer device according to the invention is employed in a horizontal transfer section of a solid-state image sensor device and when the device is designed with the same margins as in the prior art shown in FIG. 3, the distance $L_1$ in the first embodiment shown in FIG. 6 and the distance $L_2$ in the second and third embodiments shown respectively in FIGS. 8 and 9 are shorter than the distance L from the last vertical transfer electrode to the horizontal transfer section in the prior art shown in FIG. 3. Thus, it is possible to obtain a higher fringe electric field resulting in a higher efficiency in the transfer of signal charge (especially, minute level signal charge) from the vertical transfer section to the horizontal transfer section.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A charge transfer device comprising:

a semiconductor substrate of a first conductivity type;

a charge transfer region of a second conductivity type provided within a surface region of said semiconductor substrate;

an insulating film provided on said charge transfer region;

a plurality of first and second kind charge transfer electrodes alternately provided on said insulating film, said first kind charge transfer electrodes being connected together, said second kind charge transfer electrodes being divided into a first and a second group with every other ones of such electrodes respectively belonging to said first and said second group, and said second kind charge transfer electrodes of said first and second groups being, respectively, connected together;

a plurality of potential barriers of said second conductivity type each provided at an upstream portion, in terms of a charge transfer direction, of said charge transfer region beneath a corresponding one of said second kind charge transfer electrodes;

a first conductor for commonly connecting said first kind charge transfer electrodes;

a second conductor for commonly connecting said second kind charge transfer electrodes of said first group; and a third conductor for commonly connecting said second kind charge transfer electrodes of said second group, wherein said first kind charge transfer electrodes and said first conductor are formed of integral conductive materials.

2. The charge transfer device according to claim 1, wherein each of said potential barriers is self-aligned with an end of a corresponding one of said first kind charge transfer electrodes.

3. The charge transfer device according to claim 1, wherein each of said first kind charge transfer electrodes comprises a first polycrystaline silicon layer and each of said second kind charge transfer electrodes comprises a second polycrystalline silicon layer.

4. The charge transfer device according to claim 1, wherein both end portions of each of said second kind charge transfer electrodes respectively overlap end portions of said first kind charge transfer electrodes adjacent said second kind charge transfer electrodes.

5. The charge transfer device according to claim 1, which includes a further charge transfer device for transferring a signal charge into a charge transfer region beneath one of said first and second groups of the second kind charge transfer electrodes, said first kind charge transfer electrodes being electrically connected with a last one of charge transfer electrodes of said further charge transfer device.

6. The charge transfer device according to claim 1, wherein said second kind charge transfer electrodes of said first group and said second conductor are formed of integral conductive materials.

7. A charge transfer device comprising:

a semiconductor substrate of a first conductivity type;

a charge transfer region of a second conductivity type provided within a surface region of said semiconductor substrate;

an insulating film provided on said charge transfer region;

a plurality of first and second kind charge transfer electrodes alternately provided on said insulating film, said first kind charge transfer electrodes being connected together, said second kind charge transfer electrodes being divided into a first and a second group with every other ones of such electrodes respectively belonging to said first and said second group, and said second kind charge transfer electrodes of said first and second groups being, respectively, connected together;

a plurality of potential barriers of said second conductivity type each provided at an upstream portion, in terms of a charge transfer direction, of said charge transfer region beneath a corresponding one of said second kind charge transfer electrodes;

a first conductor for commonly connecting said first kind charge transfer electrodes;

a second conductor for commonly connecting said second kind charge transfer electrodes of said first group; and a third conductor for commonly connecting said second kind charge transfer electrodes of said second group, wherein said second kind charge transfer electrodes of said first group and said second conductor are formed of integral conductive materials.

8. The charge transfer device according to claim 7, wherein both end portions of each of said second kind charge transfer electrodes respectively overlap end portions of said first kind charge transfer electrodes adjacent said second kind charge transfer electrodes.

9. The charge transfer device according to claim 7, which includes a further charge transfer device for transferring a signal charge into a charge transfer region beneath one of said first and second groups of the second kind charge transfer electrodes, said first kind charge transfer electrodes being electrically connected with a last one of charge transfer electrodes of said further charge transfer device.

* * * * *